United States Patent [19]

Murase

[11] Patent Number: 5,575,886
[45] Date of Patent: Nov. 19, 1996

[54] METHOD FOR FABRICATING SEMICONDUCTOR DEVICE WITH CHEMICAL-MECHANICAL POLISHING PROCESS FOR PLANARIZATION OF INTERLAYER INSULATION FILMS

[75] Inventor: Hiroshi Murase, Tokyo, Japan

[73] Assignee: NEC Corporation, Tokyo, Japan

[21] Appl. No.: 503,088

[22] Filed: Jul. 17, 1995

[30] Foreign Application Priority Data

Jul. 30, 1994 [JP] Japan .................... 6-197407

[51] Int. Cl.⁶ ..................... H01L 21/00
[52] U.S. Cl. ............... 156/636.1; 156/637.1; 156/657.1; 216/38; 216/88; 437/228
[58] Field of Search ............. 156/636.1, 637.1, 156/645.1, 657.1; 216/38, 52, 88, 89, 91; 437/228 POL, 228 PL

[56] References Cited

U.S. PATENT DOCUMENTS 5,026,666  6/1991  Hills et al. ................ 216/38 X
5,502,007  3/1996  Murase .................... 156/636.1 X
5,502,008  3/1996  Hayakawa et al. .......... 156/636.1 X

FOREIGN PATENT DOCUMENTS 3280539  12/1991  Japan .
4192522  7/1992  Japan .

*Primary Examiner*—William Powell
*Attorney, Agent, or Firm*—Whitham, Curtis, Whitham & McGinn

[57] ABSTRACT

The method for fabricating a semiconductor device disclosed is one in which an insulation film is formed on a metal interconnect by an Electron Cyclotron Resonance Chemical Vapor Deposition (ECR CVD) process capable of applying a radio frequency bias to a substrate, a surface of the insulation film is planarized by a chemical-mechanical polishing (CMP) process, and a surface of the insulation film is cleaned. The ECR CVD process capable of applying a radio frequency bias to a substrate may be a radio frequency bias plasma CVD process or a bias sputtering process. The cleaning of the surface of the insulation film may use a hydrogen fluoride solution. It is easy to control processes without increasing the number of process steps and a high degree of planarization can be realized.

5 Claims, 3 Drawing Sheets

METHOD FOR FABRICATING SEMICONDUCTOR DEVICE WITH CHEMICAL-MECHANICAL POLISHING PROCESS FOR PLANARIZATION OF INTERLAYER INSULATION FILMS

BACKGROUND OF THE INVENTION (1) Field of the Invention

The present invention relates to a method for fabricating a semiconductor device, and more particularly to a method for fabricating a semiconductor device in which a chemical-mechanical polishing process (hereinafter referred to as a "CMP process") is applied to planarization of interlayer insulation films in a multi-layer interconnection structure.

(2) Description of the Related Art

In recent years, along with advances in higher integration in semiconductor devices, an interconnection structure is becoming more complex requiring a multi-layer interconnection structure. In such a multi-layer interconnection structure, since the interconnection layers and insulation layers are stacked one over another, if the planarized state of a surface of the insulation film is not satisfactory, there occurs a breakage in an overlying interconnection layer so that there is a need for the surface of the insulation film to be planar.

A conventional technology for planarization is disclosed, for example, in Japanese Patent Application Kokai Publication No. Hei 3-280539. The structure fabricated according to this conventional technology is shown in FIG. 1A. In this structure, to a semiconductor substrate 501, a radio frequency bias is applied using an electron cyclotron resonance (ECR) plasma CVD process to form an interlayer insulation film 507 whose buried state at interconnects having level differences is excellent. In the drawings, the reference numeral 502 denotes aluminum interconnections, and 503 denotes gate elements.

Another conventional technology is disclosed in Japanese Patent Application Kokai Publication No. Hei 4-192522, which relates to an improvement over the technology disclosed in Japanese Patent Application Kokai Publication No. Hei 3-280539. As shown in FIGS. 1B and 1C, the method disclosed is one in which first an organic film 514 is applied on an interlayer insulation film 507 formed by the ECR CVD process, and a surface of the interlayer insulation film is further planarized by etching back.

In the first conventional technology described above, in which the ECR plasma CVD process is utilized for directly planarizing the insulation film and in which the insulation film is processed only in the ECR plasma CVD process step, it is difficult to attain a high degree of planarization because, although the buried state of interconnects is excellent in sub-micron level fine pattern regions, the thickness of the insulation layer may increase in an interconnection region where the width thereof is wider than about 4 µm, or a horn-like protrusion may develop on an insulation film surface above an interconnection where the width thereof is narrower than about 2 µm.

In the above described second conventional technology in which the organic film is utilized and is then etched back, although the occurrence of the horn-like protrusion can be prevented and the planarization is improved as compared with that in the first described conventional technology, there are problems in that the planarization of the entire surface of the semiconductor substrate is difficult unless the surface of the organic film formed by the spin coating method is planar. If the extent of planarization is in this way, there will be a problem in that, where the multiplication of layers is further advanced, it will be difficult to enlarge manufacturing tolerances in processes such as a fine precision process in a photolithography process.

SUMMARY OF THE INVENTION

An object of the present invention, therefore, is to overcome the problems existing in the prior art and to provide a method for fabricating a semiconductor device in which it is possible to easily carry out the control of processes without increasing the number of process steps and which is capable of uniformly planarizing an insulation film irrespective of density of interconnection layers.

According to the invention, there is provided a method for fabricating a semiconductor device, the method comprising the steps of:

forming an insulation film on a metal interconnect by an ECR CVD process capable of applying a radio frequency bias to a substrate;

planarizing a surface of the insulation film by a chemical-mechanical polishing (CMP) process; and cleaning a surface of the insulation film.

According to the invention, a method of forming a surface of the insulation film capable of applying a radio frequency bias to a substrate may be the bias ECR CVD process, a bias plasma CVD process, or a bias sputtering process. The method for cleaning a surface of the insulation film may be an etching process using a hydrogen fluoride solution.

According to the invention, on the interconnect formed on a surface of the semiconductor substrate, the insulation film is provided by the ECR CVD process capable of applying a radio frequency bias to the substrate, and this insulation film is planarized by the CMP process and then a surface of the insulation film is etched back for cleaning by using a hydrogen fluoride solution. Only one time CVD process is used so that the surface of the insulation film can be planarized with a high precision and the number of the required process steps can be reduced.

Furthermore, when the bias plasma CVD process or the bias sputtering process is used for the formation of the insulation film, it is possible to obtain the insulation film of a uniform quality and to realize the planarization of high quality without the surface roughness to develop during the cleaning process using a hydrogen fluoride solution. Also, since the planarized state, before the polishing, of the insulation film formed is excellent, it is possible to reduce the time required for the polishing, to reduce the consumption of slurry, and to enhance the throughput in the polishing process. It is also possible to enlarge manufacturing tolerances in processes such as a fine precision process in, for example, a photolithography process.

By using a bias ECR CVD, it is possible to form an insulation film in which its surface is substantially planarized, and to ensure further planarization by additionally carrying out a cleaning process. Furthermore, the method can forgo a CVD process step and can make it easy to control processes such as an etching process.

BRIEF DESCRIPTION OF THE DRAWINGS

The above and other objects, features and advantages of the present invention will be apparent from the following description of preferred embodiment of the invention explained with reference to the accompanying drawings, in which.

PREFERRED EMBODIMENT OF THE INVENTION

Now, a preferred embodiment of the invention is explained with reference to the drawings.

Figure 1A:
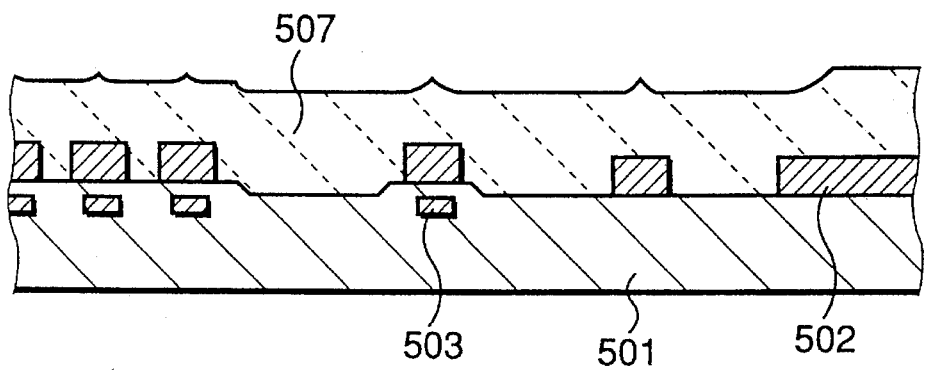
FIGS. 1A–1C are sectional views of a portion of a semiconductor device for explaining conventional planarization technologies.
Figure 1B:
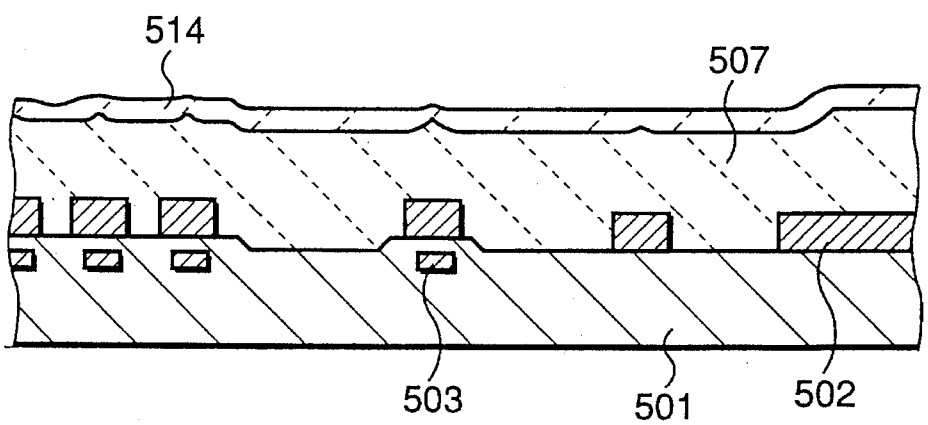
Figure 1C:
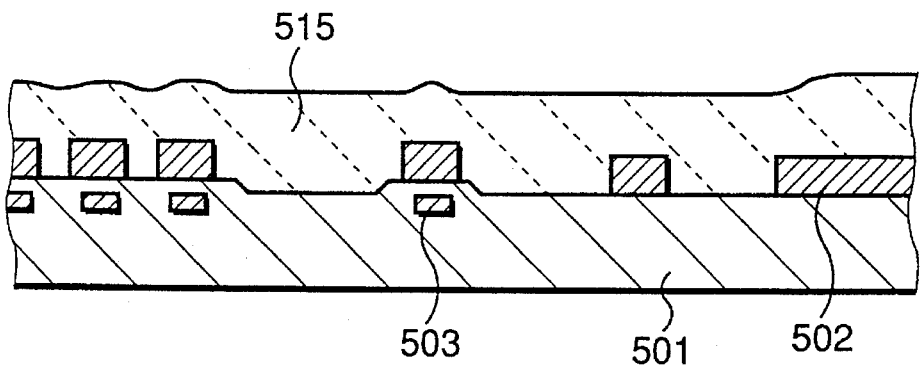
Figure 2A:
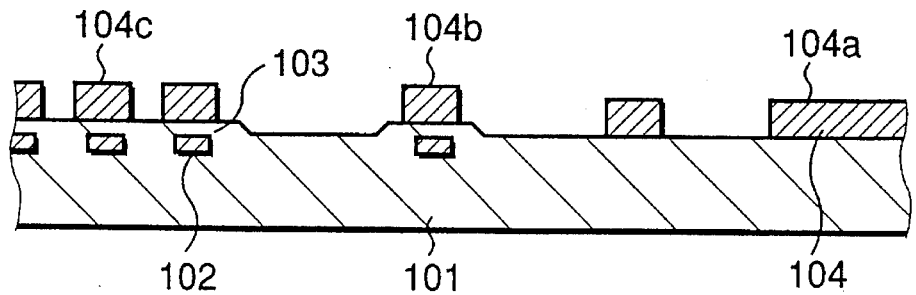
FIGS. 2A–2D are sectional views of a portion of a semiconductor device for explaining sequential steps of a method for the fabrication of an embodiment according to the invention.

FIGS. 2A–2D show diagrammatical sectional views of a structure in a sequence in which the structure is fabricated according to the embodiment of the invention. As shown in FIG. 2A, a semiconductor substrate 101 has, at its surface region, elements including gate electrodes or interconnections 102 and, over surfaces thereof, there is formed a first interlayer insulation film 103 of a silicon oxide film. On this first interlayer insulation film 103, there are aluminum interconnections 104 which are formed of appropriately patterned aluminum. The thickness of the aluminum interconnection layer is about 0.5 μm and this layer is used for forming a large area interconnection 104a, an isolated interconnection 104b, and a densely disposed interconnection bundle portion 104c.

Figure 2B:
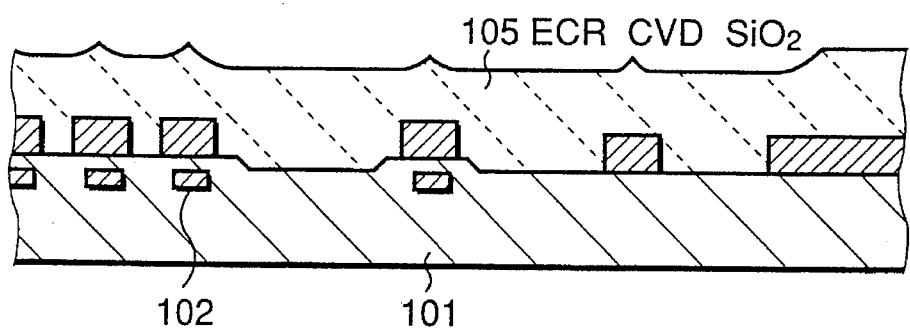
Figure 3:
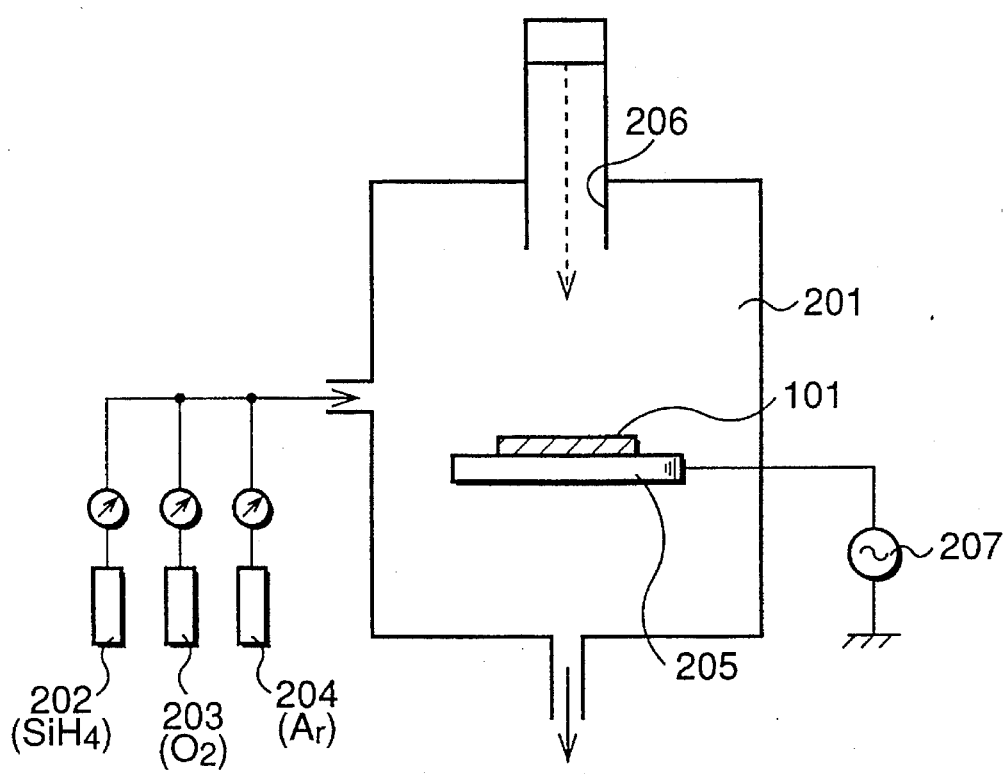
FIG. 3 is a diagram showing an example of a bias ECR CVD device used in the fabrication according to the invention.

As shown in FIG. 2B, a silicon oxide film 105 having a thickness of 2 μm is formed as a second interlayer insulation film on a semiconductor substrate 101 by an ECR CVD process capable of applying a bias thereto. FIG. 3 shows an example of a device used in the formation of the silicon oxide film 105, in which $SiH_4$ gas at a flow rate of 40 SCCM, $O_2$ gas at 50 SCCM, and Ar gas at 70 SCCM are supplied respectively from gas sources 202, 203 and 204 into a reaction chamber 201, and the pressure within the chamber 201 is maintained at 2 mTorr. The semiconductor substrate 101 is placed on an electrode 205 provided within the chamber 201, microwaves at the power of 2000 W are applied into the chamber 201 through a microwave inlet port 206 so as to generate high concentration plasma, and the bias of RF 1500 W from a radio frequency source 207 is applied to the semiconductor substrate 101 through the electrode 205, whereby a biased ECR CVD process is carried out.

The silicon oxide film 105 thus formed is such that, at the large area portion 104a of the aluminum interconnect 104 having a width larger than about 4 μm, the film formation characteristics thereof are the same as those of the planar portion and the film having a thickness of 2 μm is formed over the aluminum interconnects. On the other hand, at the isolated interconnect 104b of the aluminum interconnect 104 having a width narrower than about 2 μm, the film formation progresses with any protrusions being etched-back due to the substrate bias effects resulting in the surface planarization, and the aluminum interconnects are buried in the planarized silicon oxide film 105. Further, at the interconnect bundle portion 104c where the aluminum interconnects are densely disposed with the width of each interconnect being about 1 μm and the spaces between the respective interconnects being about 0.8 μm, these spaces are filled or buried due to the substrate bias and, after the spaces have been filled, the film formation characteristics thereof are the same as those of the planar portion.

However, when the ECR CVD process is used, although the buried state of interconnects at a region of sub-micron level fine patterns is excellent, the insulation film at an interconnection region having a width wider than about 4 μm becomes thick, and a horn-like protrusion develops on a surface portion above a fine interconnection having a width narrower than 2 μm. On the other hand, the characteristics of the silicon oxide film 105 thus formed are such that, in the film formation process subsequent to the process of burying step portions, the film formation develops only in a direction perpendicular to the surface of the substrate so that the film formed is of a uniform quality.

Figure 2C:
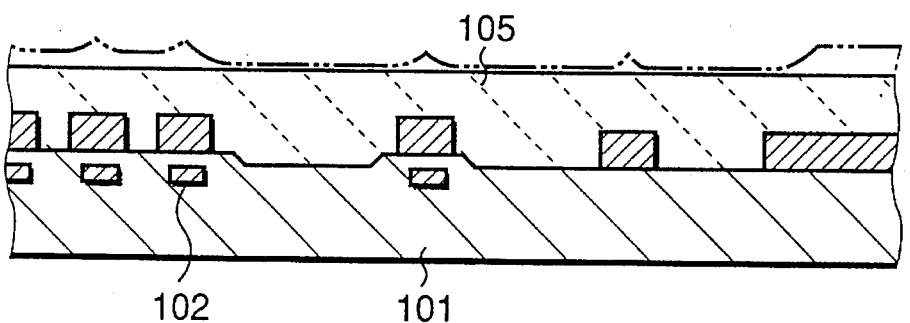
Figure 2D:
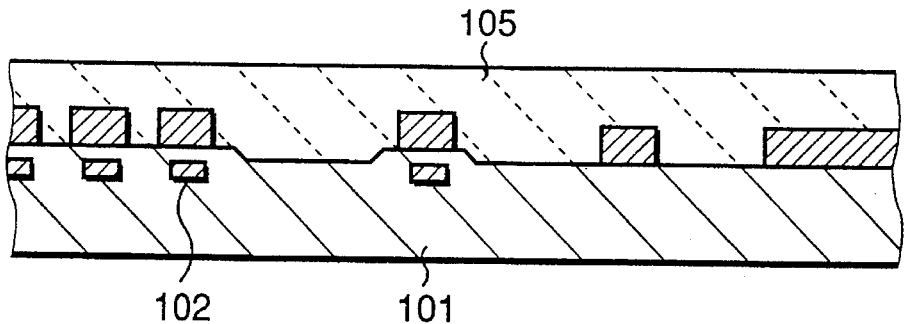
Figure 4:
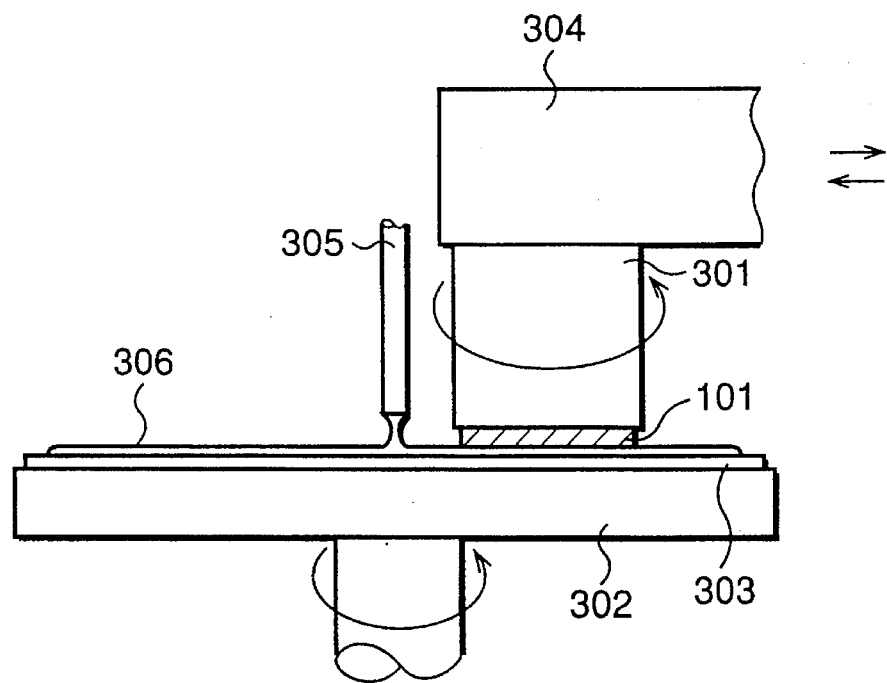
FIG. 4 is a diagram showing an example of a polishing device used in the fabrication according to the invention.

According to the invention, a surface of the silicon oxide film 105 is polished and planarized by a CMP process as shown in FIG. 2C. In the CMP process, as shown for example in FIG. 4, a semiconductor substrate 101 is fixed onto a head 301. A slurry 306 is supplied through a slurry nozzle 305 onto a polishing pad 303 which is adhered to a turn table 302. A head 301 is rotated and swung by a carrier 304. While the turn table 302 is being rotated at a predetermined speed, a physical and chemical polishing process is carried out while the polishing pad 303 is being pressed against the surface of the semiconductor substrate 101. Here, the polishing pad 303 is constituted by a hard foam pad, the pressure from the head is 400 g/cm$^2$, the revolution of the turn table 302 is 30 rpm and, as slurry 306, silica particle slurry is supplied at 200 cc/min.

In the CMP process, the aluminum interconnect 104 is planarized under a condition such that its step difference of 0.5 μm is removed and that the silicon insulation film 105 is polished by 0.5 μm at a flat portion. In this case, the polishing is made for 4 minutes. Because the polishing time period is thus made shorter, it is possible to prevent the lowering of the throughput and the increase in consumption of slurry which are suffered when the polishing time period is long.

Thereafter, for removing contaminants such as slurry adhered on the substrate during the polishing step, a brush-scribing process is carried out to scribe front and back surfaces of the substrate, then the substrate is immersed for one minute in a hydrogen fluoride solution diluted to a 1 to 100 ratio, and the surface of the silicon oxide film 105 is cleaned by etching, whereby a semiconductor substrate whose surface in the silicon oxide film 105 is completely planarized is obtained. During the cleaning process, the characteristics of the silicon oxide film 105 are such that the quality of the film formed after the process of burying a level difference is uniform because the film formation develops all in the direction perpendicular to the surface of the substrate.

According to the invention, since the silicon oxide film is formed by an ECR CVD process which is carried out by applying bias to the substrate, the quality of the silicon oxide film is uniform. Thus, even when the film formed is planarized by polishing of its surface and is etched for cleaning by using a hydrogen fluoride solution, it is possible to maintain the surface in an excellently planarized state.

The embodiment explained above relates to an example wherein the silicon oxide film is used as the interlayer insulation film. However, instead of using the silicon oxide film, the interlayer insulation film may be formed similarly by using a silicon nitride film, a boro-phosphosilicate glass (BPSG) film, a phosphosilicate glass (PSG) film, an SiON film, or an SiOF film.

Also, in the above explained embodiment, the $SiO_2$ film formed by the bias ECR plasma CVD process is used. For example, in a case where an SiOF film is formed on the interlayer insulation film by the biased ECR CVD process, since the dielectric constant of the SiOF film is lower than that of a silicon oxide film so that interlayer capacitance can be made smaller, it is possible to suppress the lowering of operation speeds of a circuit caused by an increase in the interlayer capacitance which is a problem in multi-layer interconnections. In this case, the film formation conditions in the bias ECR CVD process are such that an $SiF_4$ gas at 50 SCCM, an $O_2$ at 50 SCCM and an Ar gas at 50 SCCM are supplied and that the film is formed under a microwave power of 2000 W, an RF power of 1500 W, a pressure of 2 mTorr. All the other conditions may be the same as those for the above explained embodiment and it is possible to obtain the planarization in the interlayer insulation film of SiOF which is excellent as in the above explained embodiment.

Furthermore, when an RF bias sputtering method is used for forming the interlayer insulation film, the same effect as that already explained is obtained. By way of an example, with the silicon oxide as a target, a film having a thickness of about 2 μm has been obtained under the conditions such that an RF power is at 3 kW, an argon gas pressure is at 3 mTorr, and an RF bias to the substrate is at 150 V.

While the invention has been described in its preferred embodiment, it is to be understood that the words which have been used are words of description rather than limitation and that changes within the purview of the appended claims may be made without departing from the true scope and spirit of the invention as defined by the claims.

What is claimed is:

1. A method for fabricating a semiconductor device, the method comprising the steps of:

forming an insulation film on a metal interconnect by an Electron Cyclotron Resonance Chemical Vapor Deposition (ECR CVD) process capable of applying a radio frequency bias to a substrate;

planarizing a surface of said insulation film by a chemical-mechanical polishing (CMP) process; and cleaning a surface of said insulation film.

2. The method for fabricating a semiconductor device according to claim 1, in which said ECR CVD process capable of applying a radio frequency bias to a substrate is a radio frequency bias plasma CVD process.

3. The method for fabricating a semiconductor device according to claim 1, in which said ECR CVD process capable of applying a radio frequency bias to a substrate is a bias sputtering process.

4. The method for fabricating a semiconductor device according to claim 1, in which said process for cleaning a surface of the insulation film is a process using a hydrogen fluoride solution.

5. The method for fabricating a semiconductor device according to claim 1, in which said insulation film is one of a silicon oxide film, a silicon nitride film, a boro-phosphosilicate glass (BPSG) film, a phosphosilicate (PSG) film, a silicon oxide nitride (SION) film, and a silicon fluoride oxide (SiOF) film.

* * * * *